(12) United States Patent
Wang et al.

(10) Patent No.: US 7,855,586 B2
(45) Date of Patent: Dec. 21, 2010

(54) FREQUENCY JITTER GENERATOR AND PWM CONTROLLER

(75) Inventors: Chen-Hsung Wang, Sinjhuang (TW); Wei-Liang Kung, Taipei (TW); Chung-Cheng Wu, Sindian (TW)

(73) Assignee: Niko Semiconductor Co., Ltd. (TW)

( * ) Notice: Subject to any disclaimer, the term of this patent is extended or adjusted under 35 U.S.C. 154(b) by 88 days.

(21) Appl. No.: 12/347,074

(22) Filed: Dec. 31, 2008

(65) Prior Publication Data

US 2009/0302911 A1 Dec. 10, 2009

(30) Foreign Application Priority Data

Jun. 6, 2008 (TW) ................................. 097121305

(51) Int. Cl.
*H03K 3/017* (2006.01)
(52) U.S. Cl. ...................................... 327/172; 327/296
(58) Field of Classification Search ........................ None See application file for complete search history.

(56) References Cited

U.S. PATENT DOCUMENTS

| | | | | |
|---|---|---|---|---|
| 6,819,154 B2 * | 11/2004 | Greenfeld | .................. | 327/172 |
| 6,903,537 B2 * | 6/2005 | Tzeng et al. | ................ | 323/268 |
| 7,106,130 B2 * | 9/2006 | Gan et al. | .................... | 330/10 |
| 7,184,283 B2 * | 2/2007 | Yang et al. | .................... | 363/41 |

* cited by examiner

*Primary Examiner*—Cassandra Cox
(74) *Attorney, Agent, or Firm*—Schmeiser, Olsen & Watts, LLP

(57) ABSTRACT

A frequency jitter generator and a frequency jitter PWM controller are provided for overcoming the shortcoming that a conventional PWM controller reduces the electromagnetic interference issue by means of varying the operating frequency of the PWM controller based on an input voltage, while resulting in the uncertainty of the range of frequency jitter and the difficulty circuit design due to the effect of the input voltage and the load. The frequency jitter generator and PWM controller adjust the range of frequency jitter by using a signal within a fixed voltage range. The invention not only gets rid of the effect of the input voltage and the loading, but also simplifies the circuit design by fixing the range of frequency jitter no greater than a predetermined percentage regardless of the operating frequency of the PWM controller.

16 Claims, 5 Drawing Sheets

FREQUENCY JITTER GENERATOR AND PWM CONTROLLER

FIELD OF THE INVENTION

The present invention relates to a frequency jitter generator, and more particularly to a pulse width modulation (PWM) controller with the frequency jitter generator for maintaining the change of operating frequency within a predetermined percentage.

BACKGROUND OF THE INVENTION

Since the power sources used by most electronic equipments are DC power sources, it is necessary to use a power supply device or a rectifier to convert AC power into electric power of various DC voltages required by different electronic equipments. Based on different circuit designs, the power supply device can be sorted mainly into two types, linear power supply device and switching power supply device. The switching power supply device comes with a more complicated circuit layout, a larger ripple, and a larger electromagnetic interference than the linear power supply device. However, the switching power supply device has many advantages including high conversion efficiency, low power consumption at empty load, and light weight. Overall speaking, the switching power supply device is still superior to the linear power supply device, and thus becoming a mainstream of power supply devices in the market.

In general, a switching power supply device is operated at high frequency to reduce the size of required electronic components, but the high operation frequency also causes an issue of electromagnetic interference (EMI). In addition to generating the noise to the power supply that will affect the electronic equipments, the electromagnetic wave also affects nearby wireless communication equipments and transmissions of radio and television signals.

Traditionally, an EMI filter is installed at an input terminal of a power supply to reduce electromagnetic interference. The EMI filter is generally composed of an inductor, a capacitor, and a resistor for filtering the electromagnetic interference. However, the larger the electromagnetic interference, the larger the EMI filter is required, and thus incurring a higher cost of the circuit. In addition, the EMI filter cannot handle the radiation due to electromagnetic interference.

With reference to FIG. 1 for a conventional frequency jitter power supply device, a rectified voltage 15 is produced after an AC voltage 5, which is filtered by an EMI filter 120, is rectified by a rectifier 10. The rectified voltage 15 is inputted to a primary winding 35 of a transformer 40 after the rectified voltage 15 is filtered by the filter capacitor 20 so as to generate output on a secondary winding 45 of the transformer 40. The output of the secondary winding 45 is rectified through a secondary rectifier 50 to a capacitor 55 to generate an output voltage 60 at a power output terminal 65. The PWM controller 90 receives a feedback signal from a feedback loop composed of a feedback resistor 80, a Zener diode 75, and an optical coupler 70 at a feedback pin 85, and adjusts a duty cycle of a built-in transistor switch to modulate an electric power inputted to the primary side 35 for the effect of stabilizing the output voltage 60.

A PWM controller 90 receives a jitter current 135 from an electromagnetic interference resistor 140 at frequency jitter pins 125 and 130. The jitter current 135 varied with the change of ripple composition of the rectified voltage 15 changes the frequency of a triangle wave signal from a frequency generator in the PWM controller 90. The triangle wave signal of the frequency generator serves as a comparison reference of the feedback signal, and thus affects the switching frequency of the transistor switch. Thereby, the switching frequency of the transistor switch would be expanded to a wider frequency band, so that the peak of the electromagnetic interference wave can be dropped down to achieve the effect of reducing electromagnetic interference.

Since the ripple composition varies with the input voltage and the output load, it is difficult to select an appropriate electromagnetic interference resistor 140 in practical applications. In addition, the range (or percentage) of frequency jitter also varies with the input voltage, which makes the usage and design more inconvenient and difficult.

SUMMARY OF THE INVENTION

In view of the foregoing shortcomings of the prior art that achieves the effect of reducing electromagnetic interference by using an input voltage to change the frequency of a PWM controller, the influence of the input voltage and the output load causes uncertainty of the range of the frequency jitter and results in the difficulty for circuit design, the inventor of the present invention based on years of experience to conduct extensive researches and experiments, and finally developed a frequency jitter generator and a frequency jitter PWM controller in accordance with the present invention to overcome the shortcomings of the prior art.

Therefore, the primary objective of the present invention is to provide a frequency jitter generator and a frequency jitter PWM controller using a signal with a fixed voltage range to modulate a frequency signal of the frequency generator. The invention not only prevents the range of frequency jitter from being affected by the input voltage and the output load, but also fixes the frequency jitter range within a predetermined percentage range regardless the magnitude of the operating frequency of the PWM controller so as to simplify the circuit design.

To achieve the foregoing objective, the present invention provides a frequency jitter generator, comprising a frequency generator and a frequency jitter controller. The frequency generator comprises a charge current source, a discharge current source, and a capacitor. The charge current source and the discharge current source are electrically coupled to the capacitor for charging and discharging the capacitor respectively. The frequency generator receives a first reference level signal and a second reference level signal, and charges and discharges the capacitor according to the first reference level signal and the second reference level signal respectively, such that the voltage of the capacitor varies between the first reference level signal and the second reference level signal to generate a frequency signal. The frequency jitter controller is coupled to the frequency generator for controlling the magnitude of current of at least one of the charge current source and the discharge current source varied within a predetermined range.

The present invention also provides a frequency jitter PWM controller, comprising a feedback processor, a frequency jitter controller, a frequency generator, and a PWM signal generator. The feedback processor generates a feedback processing signal according to a detection signal representing a loading status. The frequency jitter controller generates a ramp wave signal. The level of the ramp wave signal varies within a predetermined voltage range. The frequency generator is utilized for generating a frequency signal. The frequency of the frequency signal varies within a predetermined frequency range according to the ramp wave signal. The PWM signal generator generates an ON/OFF control signal according to the feedback processing signal and the frequency signal to control the switching of at least one semiconductor switch.

The above and other objects, features and advantages of the present invention will become apparent from the following detailed description taken with the accompanying drawing.

DESCRIPTION OF THE PREFERRED EMBODIMENT

Figure 1:
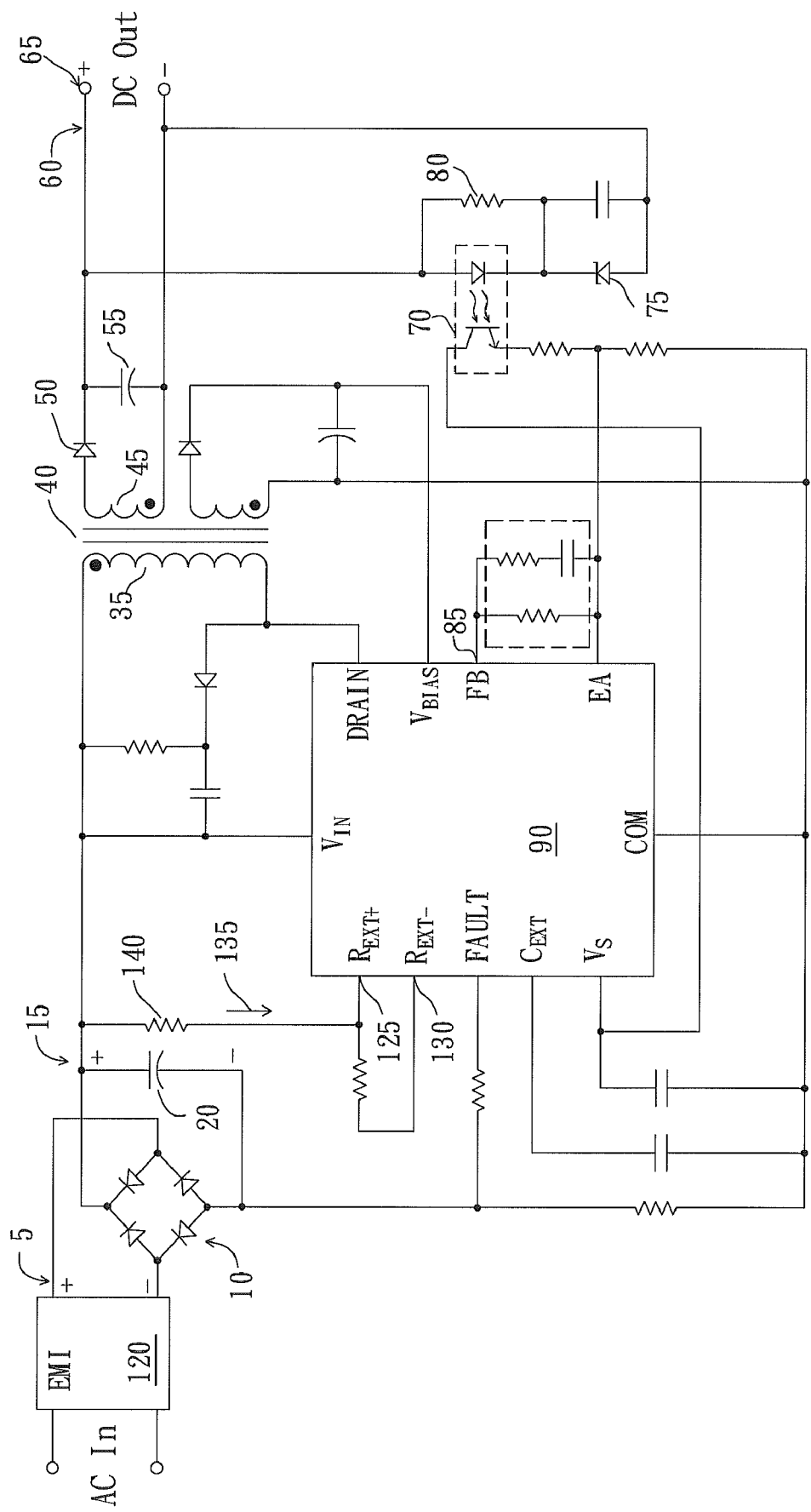
FIG. 1 is a schematic circuit diagram of a conventional frequency jitter power supply device.
Figure 2:
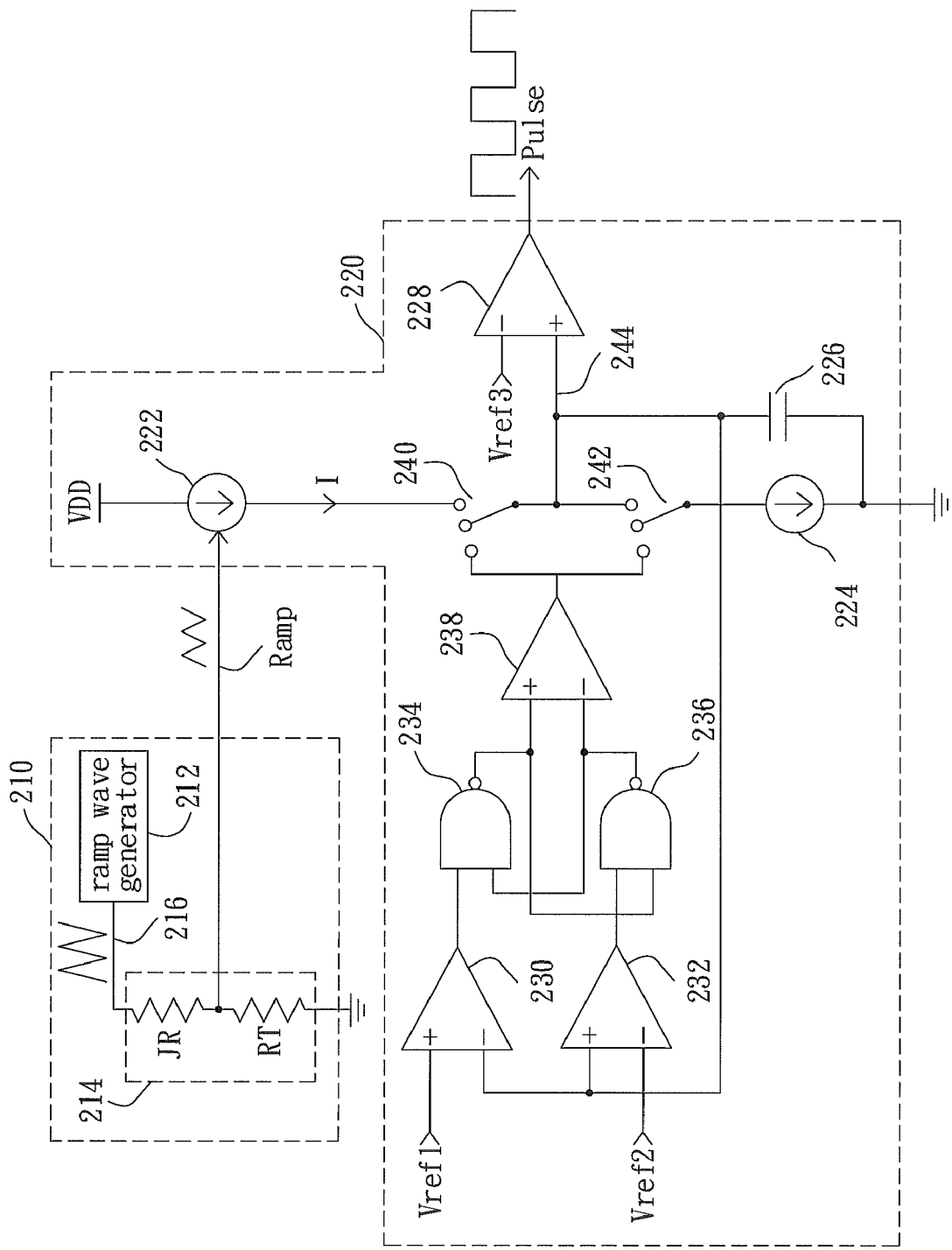
FIG. 2 is a schematic circuit diagram of a frequency jitter generator in accordance with a preferred embodiment of the present invention.

With reference to FIG. 2 for a circuit diagram of a frequency jitter generator in accordance with a preferred embodiment of the present invention, the frequency jitter generator comprises a frequency jitter controller 210 and a frequency generator 220, wherein the frequency jitter controller 210 is coupled to the frequency generator 220. The frequency jitter controller 210 comprises a ramp wave generator 212 for generating a ramp wave signal 216 and a voltage divider 214, which is composed of a frequency jitter resistor JR and a frequency setting resistor RT for dividing the voltage of the ramp wave signal 216 to output the divided ramp wave signal Ramp. The frequency generator 220 comprises a charge current source 222, a discharge current source 224, and a capacitor 226. The charge current source 222 and the discharge current source 224 are electrically coupled to the capacitor 226 for charging and discharging the capacitor 226. The frequency generator 220 receives a first reference level signal Vref1 and a second reference level signal Vref2 and charges and discharges the capacitor 226 according to the first reference level signal Vref1 and the second reference level signal Vref2 respectively. Thus, the voltage level of the capacitor 226 varies between the first reference level signal Vref1 and the second reference level signal Vref2 to generate a frequency signal 244. In this preferred embodiment, the charge current source 222 receives the divided ramp wave signal Ramp and produces a current I according to the fluctuation of the divided ramp wave signal Ramp, so that the magnitude of the current I varies within a predetermined range. Thus, regardless the frequency generated by the frequency generator 220, the range of frequency jitter of the frequency generator 220 varies within a predetermined percentage. In practical applications, the charge current source 222 and/or the discharge current source 224 can receive the divided ramp wave signal Ramp and generate a charge and/or discharge current according to the fluctuation of the ramp wave signal 216. It is noted that the frequency of the divided ramp wave signal Ramp is smaller than the operating frequency of the frequency generator 220.

The frequency generator 220 further comprises a first comparator 230, a second comparator 232, a first NAND gate 234, a second NAND gate 236, a third comparator 238, a first switch 240, a second switch 242, and a fourth comparator 228. The first comparator 230 compares the frequency signal 244 with the first reference level signal Vref1 and outputs a comparison result signal, and the second comparator 232 compares the frequency signal 244 with the second reference level signal Vref2 and outputs another comparison result signal. The first NAND gate 234 receives outputs of the first comparator 230 and the second NAND gate 236 to perform NAND operation, and the second NAND gate 236 receives outputs of the second comparator 232 and the first NAND gate 234 to perform NAND operation. The third comparator 238 receives outputs of the first NAND gate 234 and the second NAND gate 236 to control the switching of the first switch 240 and the second switch 242. When the level of the frequency signal 244 rises to a level greater than the first reference level signal Vref1, the first switch 240 is turned off and the second switch 242 is turned on, so that the capacitor 226 starts discharging. When the level of the frequency signal 244 drops to a level below the second reference level signal Vref2, the first switch 240 is turned on and the second switch 242 is turned off, so that the capacitor 226 starts charging. The ramp frequency signal 244 is thus generated by repeating the aforementioned procedure. The fourth comparator 228 compares the ramp frequency signal 244 with a third reference level signal Vref3 to convert the ramp frequency signal 244 into a pulse signal Pulse.

Figure 3:
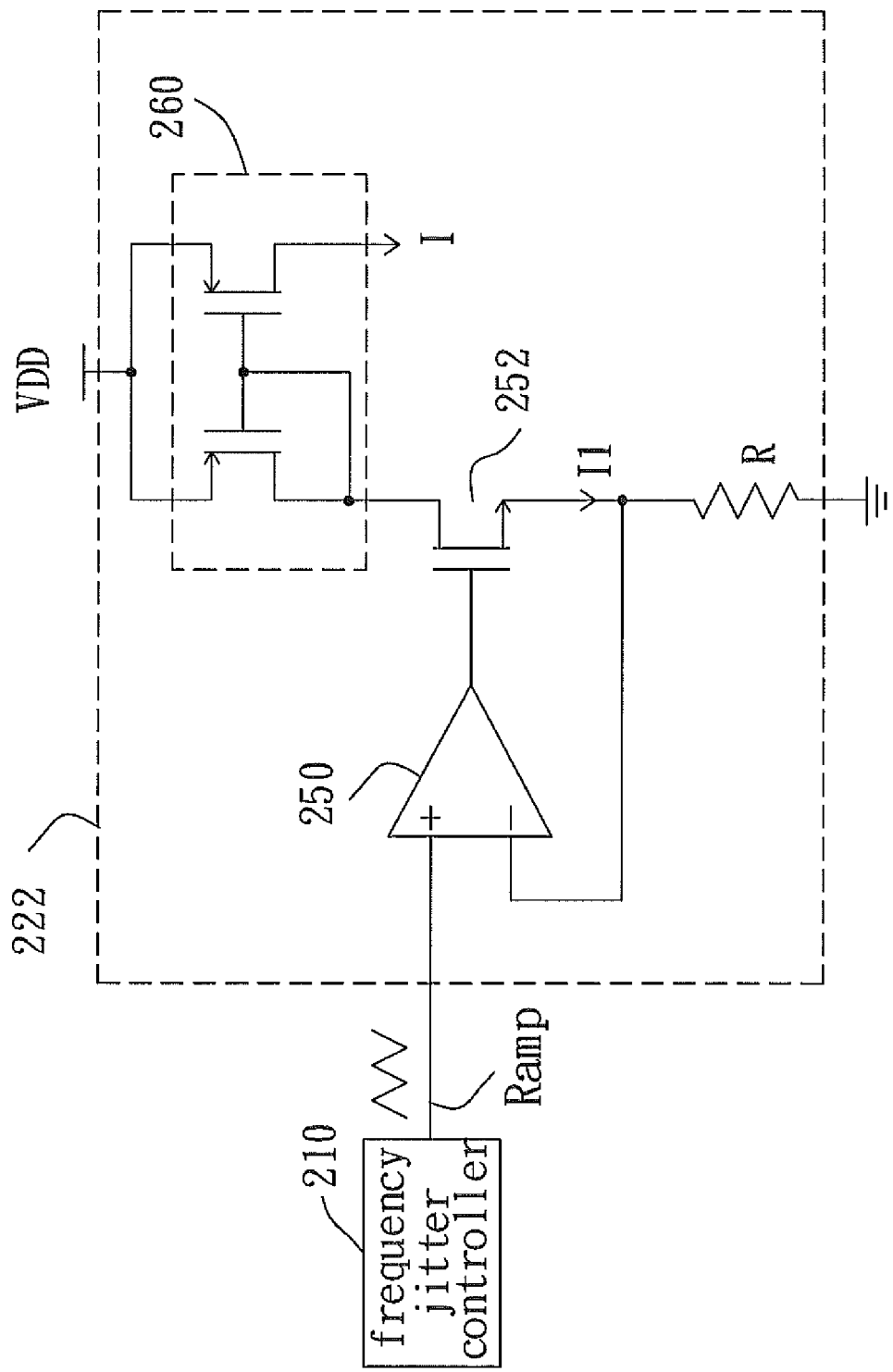
FIG. 3 is a schematic circuit diagram of a charge current source of FIG. 2.

With reference to FIG. 3 for a circuit diagram of a charge current source of FIG. 2, the charge current source 222 is a voltage-to-current converter, which converts the level of the ramp wave signal Ramp into a charge current I. The charge current source 222 comprises an error amplifier 250, a transistor switch 252, a resistor R, and a current mirror 260, wherein the error amplifier 250 and the transistor switch 252 composes a voltage follower for keeping the level at the junction between the transistor switch 252 and the resistor R equal to the level of the ramp wave signal Ramp. Therefore, the current I1 (I1=V/R, where V is the level of the ramp wave signal Ramp) passing through the resistor R is mirrored by the current mirror 260 to form a charge current I. Similarly, the same circuit layout can be used in the discharge current source to generate the discharge current according to the fluctuation of the level of the ramp wave signal Ramp.

Figure 4:
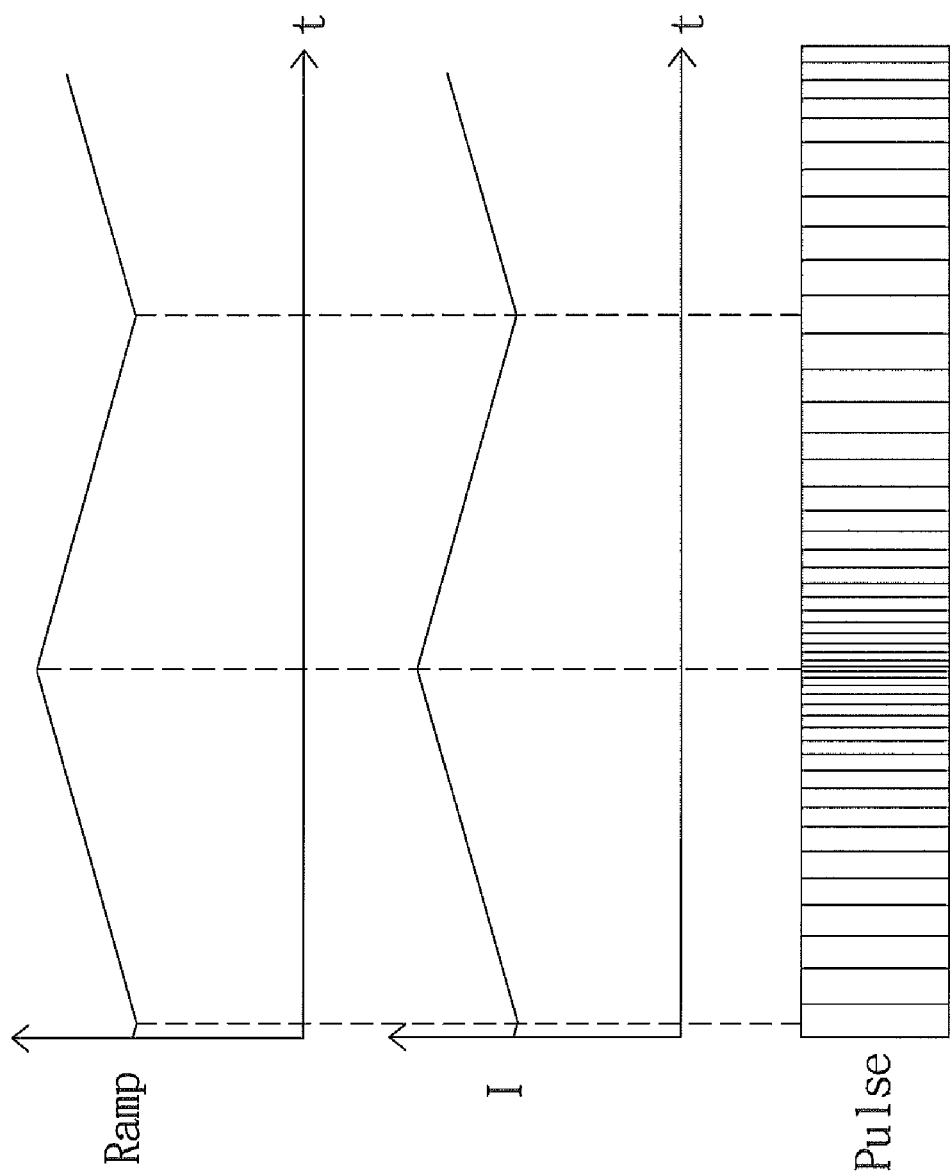
FIG. 4 is a chart showing the level of a ramp wave signal (Ramp), the magnitude of a charge current (I) and the timing of a pulse signal (Pulse)

FIG. 4 is a timing diagram showing the level of the ramp wave signal Ramp, the magnitude of the charge current I, and the pulse signal Pulse. As shown, when the level of the ramp wave signal Ramp rises, the charge current I becomes larger, so that the frequency of the pulse signal Pulse is increased. On the other hand, when the level of the ramp wave signal Ramp drops, the charge current I becomes smaller, so that the frequency of the pulse signal Pulse is decreased.

Figure 5:
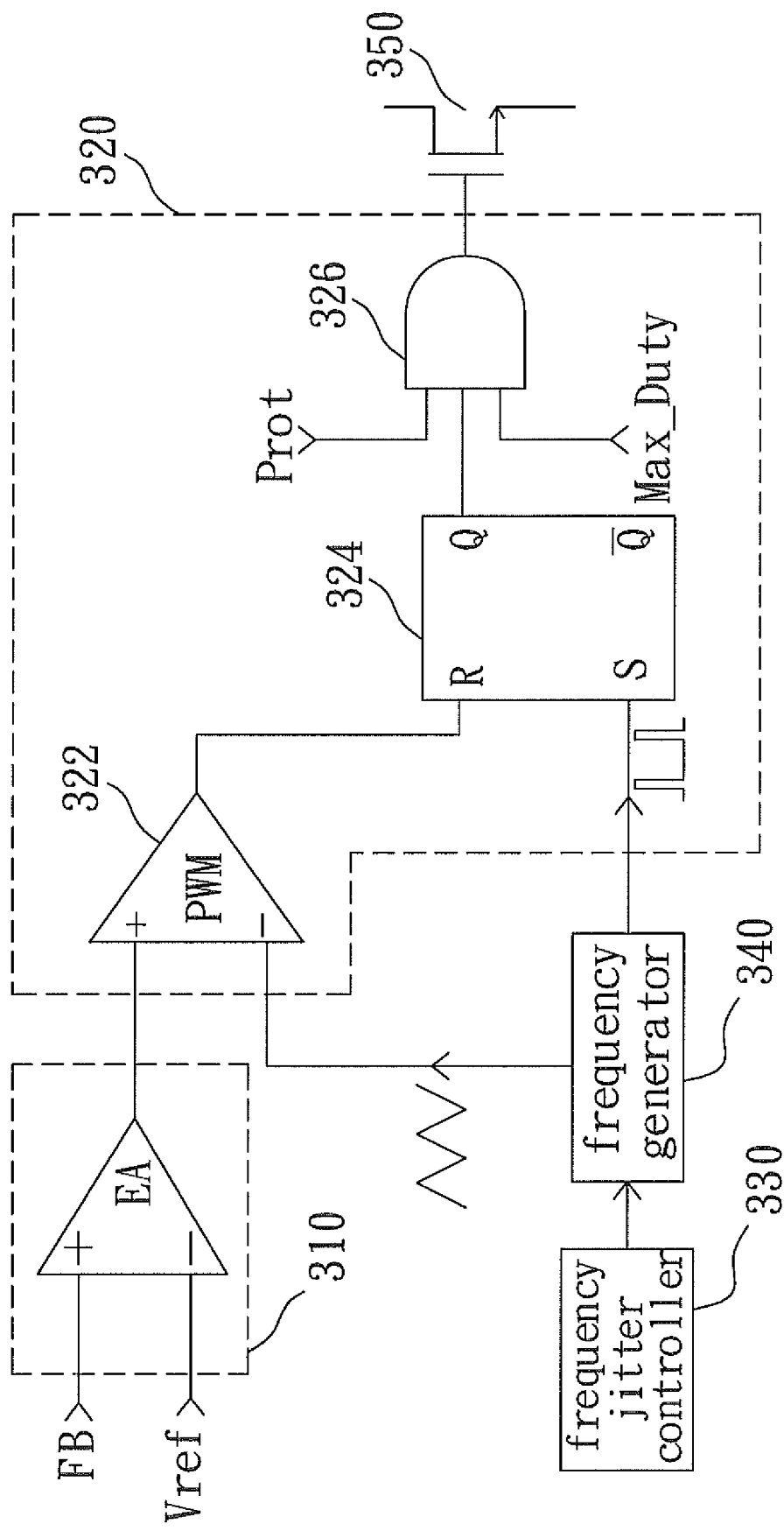
FIG. 5 is a schematic circuit diagram of a frequency jitter PWM controller in accordance with a preferred embodiment of the present invention.

With reference to FIG. 5 for a circuit diagram of a frequency jitter PWM controller in accordance with a preferred embodiment of the present invention, the PWM controller comprises a feedback processor 310, a frequency jitter controller 330, a frequency generator 340, and a PWM signal generator 320. The feedback processor 310 comprises an error amplification signal generator EA for generating a feedback processing signal according to a detection signal FB representing a loading status and a reference voltage signal Vref. The frequency jitter controller 330 generates a ramp wave signal. The level of the ramp wave signal varies within a predetermined range. The frequency generator 340 is coupled to the frequency jitter controller 330 for generating a frequency signal, wherein the frequency of the frequency signal varies within a predetermined frequency range according to the ramp wave signal. The PWM signal generator 320 generates an ON/OFF control signal according to the feedback processing signal and the frequency signal to control the switching of a semiconductor switch 350. The PWM signal generator 320 comprises a PWM comparator 322, a SR flip-flop 324, and an AND gate 326. The PWM comparator 322 receives the feedback processing signal and a triangle wave signal generated by the frequency generator 340 and outputs a comparison result to the R terminal of the SR flip-flop 324. The S terminal of the SR flip-flop 324 receives a pulse signal generated by the frequency generator 340, and outputs an ON/OFF control signal at an output terminal Q. The AND gate 326 receives the ON/OFF control signal, a protection signal Prot, and a maximum duty cycle signal Max_Duty to control the switching of the semiconductor switch 350.

Since the frequency jitter generator and the frequency jitter PWM controller in accordance with the present invention adopt the signal restricted in a predetermined voltage range to modulate the frequency signal of the frequency generator, the frequency jitter range would be rid of the influence by the input voltage and the output load, and be kept within a predetermined percentage range regardless the operating frequency of the PWM controller. Thus, the circuit design is simplified. In addition, the frequency jitter range can be adjusted by the ratio of the frequency jitter resistor JR to the frequency setting resistor RT, which not only provide a more accurate adjustment but also extend the scope of applications because the range of frequency jitter can be adjusted corresponding to different circuits.

While the invention has been described by means of specific embodiments, numerous modifications and variations could be made thereto by those skilled in the art without departing from the scope and spirit of the invention set forth in the claims.

What is claimed is:

1. A frequency jitter generator, comprising:
   a frequency generator, including a charge current source, a discharge current source, and a capacitor, the charge current source and the discharge current source being electrically coupled to the capacitor for charging and discharging the capacitor respectively, and the frequency generator being utilized for receiving a first reference level signal and a second reference level signal and charging and discharging the capacitor according to the first reference level signal and the second reference level signal respectively, such that the voltage of the capacitor varies between the first reference level signal and the second reference level signal to generate a frequency signal; and
   a frequency jitter controller, coupled to the frequency generator, including a ramp wave generator for generating a ramp wave signal to control the magnitude of currents of the charge current source and the discharge current source, for controlling the current of at least one of the charge current source and the discharge current source changed within a predetermined range.

2. The frequency jitter generator of claim 1, wherein a frequency of the ramp wave signal is smaller than the frequency of the frequency signal.

3. The frequency jitter generator of claim 2, wherein the charge current source is a voltage-to-current converter, which converts the level of the ramp wave signal into a charge current.

4. The frequency jitter generator of claim 2, wherein the discharge current source is a voltage-to-current converter, which converts the level of the ramp wave signal into a discharge current.

5. The frequency jitter generator of claim 2, wherein the frequency jitter controller further comprises a voltage divider for dividing the voltage of the ramp wave signal to control the magnitude of currents of the charge current source and the discharge current source.

6. The frequency jitter generator of claim 5, wherein the charge current source is a voltage-to-current converter, which converts the level of the ramp wave signal into a charge current.

7. The frequency jitter generator of claim 5, wherein the discharge current source is a voltage-to-current converter, which converts the level of the ramp wave signal into a discharge current.

8. A frequency jitter PWM controller, comprising:
   a feedback processor, for generating a feedback processing signal according to a detection signal representing a loading status;
   a frequency jitter controller, for generating a ramp wave signal, and the level of the ramp wave signal being changed within a predetermined range;
   a frequency generator, for generating a frequency signal, and the frequency of the frequency signal being changed within a predetermined frequency range according to the ramp wave signal; and
   a PWM signal generator, for generating an ON/OFF control signal according to the feedback processing signal and the frequency signal to control the switching of at least one semiconductor switch.

9. The frequency jitter PWM controller of claim 8, wherein the frequency jitter controller comprises a ramp wave generator for generating the ramp wave signal, and the frequency of the ramp wave signal is smaller than the frequency of the frequency signal.

10. The frequency jitter PWM controller of claim 9, wherein the frequency generator comprises a charge current source, a discharge current source, and a capacitor, the charge current source and the discharge current source are electrically coupled to the capacitor for charging and discharging the capacitor respectively, and the frequency generator receives a first reference level signal and a second reference level signal and charges and discharges the capacitor according to the first reference level signal and the second reference level signal respectively, so that the voltage of the capacitor varies between the first reference level signal and the second reference level signal to generate the frequency signal.

11. The frequency jitter PWM controller of claim 10, wherein the charge current source is a voltage-to-current converter, which converts the level of the ramp wave signal into a charge current.

12. The frequency jitter PWM controller of claim 10, wherein the discharge current source is a voltage-to-current converter, which converts the level of the ramp wave signal into a discharge current.

13. The frequency jitter PWM controller of claim 10, wherein the current of at least one of the charge current source and the discharge current source varies within a predetermined range according to the ramp wave signal.

14. The frequency jitter PWM controller of claim 13, wherein the frequency jitter controller further comprises a voltage divider, and the voltage of the ramp wave signal is divided by the voltage divider to control the magnitude of currents of the least one of the charge current source and the discharge current source.

15. The frequency jitter PWM controller of claim 14, wherein the charge current source is a voltage-to-current converter, which converts the level of the ramp wave signal into a charge current.

16. The frequency jitter PWM controller of claim 14, wherein the discharge current source is a voltage-to-current converter, which converts the level of the ramp wave signal into a discharge current.

* * * * *